(12) United States Patent
Carey et al.

(10) Patent No.: US 7,167,346 B2
(45) Date of Patent: Jan. 23, 2007

(54) EXTRAORDINARY MAGNETORESISTANCE SENSOR WITH PERPENDICULAR MAGNETIC BIASING BY AN ANTIFERROMAGNETIC/FERROMAGNETIC EXCHANGE-COUPLED STRUCTURE

(75) Inventors: Matthew J. Carey, San Jose, CA (US);
Bruce A. Gurney, San Rafael, CA (US); Stefan Maat, San Jose, CA (US);
Neil Smith, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 388 days.

(21) Appl. No.: 10/883,204

(22) Filed: Jun. 30, 2004

(65) Prior Publication Data

US 2006/0002030 A1    Jan. 5, 2006

(51) Int. Cl.
*G11B 5/33* (2006.01)
(52) U.S. Cl. ..................................................... 360/313
(58) Field of Classification Search ................ 360/313, 360/326, 324, 319; 324/252; 428/692; 338/32 R
See application file for complete search history.

(56) References Cited

U.S. PATENT DOCUMENTS

| | | | |
|---|---|---|---|
| 5,965,283 A | 10/1999 | Solin et al. | |
| 6,353,317 B1 | 3/2002 | Green et al. | |
| 6,650,513 B1 | 11/2003 | Fullerton et al. | |
| 6,707,122 B1 | 3/2004 | Hines et al. | |
| 6,714,374 B1 | 3/2004 | Hayashi et al. | |

| | | | |
|---|---|---|---|
| 2003/0128476 A1 | 7/2003 | Gill et al. | |
| 2004/0218309 A1* | 11/2004 | Seigler | 360/313 |

FOREIGN PATENT DOCUMENTS

JP     2001223411    *   8/2001

OTHER PUBLICATIONS

T. Zhou, et al. "Extraordinary magnetoresistance in externally shunted van der Pauw plates", Appl. Phys. Lett., vol. 78, No. 5, Jan. 29, 2001, pp. 667-669.
S. A. Solin et al., "Nonmagnetic semiconductors as read-head sensors for ultra-high-density magnetic recording", Appl. Phys. Lett., vol. 80, No. 21, May 27, 2002, pp. 4012-4014.

* cited by examiner

*Primary Examiner*—Angel Castro
(74) *Attorney, Agent, or Firm*—Thomas R. Berthold (57) ABSTRACT

An extraordinary magnetoresistance (EMR) sensor has an antiferromagnetic/ferromagnetic exchange-coupled bilayer structure on top of the EMR active film. The ferromagnetic layer in the bilayer structure has perpendicular magnetic anisotropy and is exchange-biased by the antiferromagnetic layer. The antiferromagnetic/ferromagnetic bilayer structure provides a magnetic field perpendicular to the plane of the EMR active film to bias the magnetoresistance vs. field response of the EMR sensor. The ferromagnetic layer may be formed of any of the ferromagnetic materials useful for perpendicular magnetic recording, and is prepared in a way that its anisotropy axis is significantly out-of-plane. The antiferromagnetic layer is formed of any of the known Mn alloys, such as PtMn, NiMn, FeMn, IrMn, PdMn, PtPdMn and RhMn, or any of the insulating antiferromagnetic materials, such as those based on the cobalt oxide and nickel oxide antiferromagnetic materials.

22 Claims, 5 Drawing Sheets

EXTRAORDINARY MAGNETORESISTANCE SENSOR WITH PERPENDICULAR MAGNETIC BIASING BY AN ANTIFERROMAGNETIC/FERROMAGNETIC EXCHANGE-COUPLED STRUCTURE

BACKGROUND OF THE INVENTION

1. Field of the Invention

This invention relates generally to a magnetoresistive sensor, and more particularly to such a sensor based on extraordinary magnetoresistance (EMR).

2. Description of the Related Art

A magnetoresistive sensor based on extraordinary magnetoresistance (EMR) has been proposed as a read-head sensor for magnetic recording hard disk drives. Because the active region in the EMR sensor is formed of nonmagnetic semiconductor materials, the EMR sensor does not suffer from the problem of magnetic noise that exists in read-head sensors based on giant magnetoresistance (GMR) and tunneling magnetoresistance (TMR), both of which use magnetic films in their active regions.

The EMR includes a pair of voltage leads and a pair of current leads in contact with one side of the active region and an electrically conductive shunt in contact with the other side of the active region. In the absence of an applied magnetic field, sense current through the current leads passes into the semiconductor active region and is shunted through the shunt. When an applied magnetic field is present, current is deflected from the shunt and passes primarily through the semiconductor active region. The change in electrical resistance due to the applied magnetic field is detected across the voltage leads. EMR is described by T. Zhou et al., "Extraordinary magnetoresistance in externally shunted van der Pauw plates", *Appl. Phys. Lett.*, Vol. 78, No. 5, 29 Jan. 2001, pp. 667–669. An EMR sensor for read-head applications is described by S. A. Solin et al., "Nonmagnetic semiconductors as read-head sensors for ultra-high-density magnetic recording", *Appl. Phys. Lett.*, Vol. 80, No. 21, 27 May 2002, pp. 4012–4014.

One of the problems of the EMR sensor is that its magnetoresistance is an approximately quadratic function of the applied magnetic field. Thus the magnetoresistance response is small and nonlinear in the presence of the small magnetic fields from the recorded magnetic media. Biasing of the EMR sensor has been proposed by an asymmetric location of the voltage leads. Biasing of the EMR sensor has also been proposed by use of a single ferromagnetic layer that applies a perpendicular magnetic field to the sensor, as described in U.S. Pat. No. 6,714,374.

What is needed is an EMR sensor with improved magnetic field biasing so the sensor has higher magnetoresistance in small applied magnetic fields and a more linear response to the applied magnetic field.

SUMMARY OF THE INVENTION

The invention is an EMR sensor that uses an antiferromagnetic/ferromagnetic exchange-coupled bilayer structure to provide perpendicular magnetic biasing for the sensor. The ferromagnetic layer in the bilayer structure has perpendicular magnetic anisotropy and is exchange-biased by the antiferromagnetic layer. The antiferromagnetic/ferromagnetic bilayer structure is on top of the EMR active film and provides a magnetic field perpendicular to the plane of the active film to bias the magnetoresistance vs. field response of the EMR sensor.

The ferromagnetic layer may be formed of any ferromagnetic material or multilayer that can be prepared in a way that its magnetization can be oriented substantially perpendicular to the plane of the layer. Magnetization substantially perpendicular-to-the-plane can be achieved by selecting a ferromagnetic material having an intrinsic substantial out-of-plane magnetic anisotropy. The antiferromagnetic layer is formed of any of the known Mn alloys, such as PtMn, NiMn, FeMn, IrMn, PdMn, PtPdMn and RhMn, or any of the insulating antiferromagnetic materials, such as those based on the cobalt oxide and nickel oxide antiferromagnetic materials. Either the ferromagnetic layer or the antiferromagnetic layer may be the lower layer in the bilayer structure. A diffusion barrier may be located between the EMR active film and the antiferromagnetic/ferromagnetic exchange-coupled bilayer.

For a fuller understanding of the nature and advantages of the present invention, reference should be made to the following detailed description taken together with the accompanying figures.

DETAILED DESCRIPTION OF THE INVENTION

Prior Art

Figure 1:
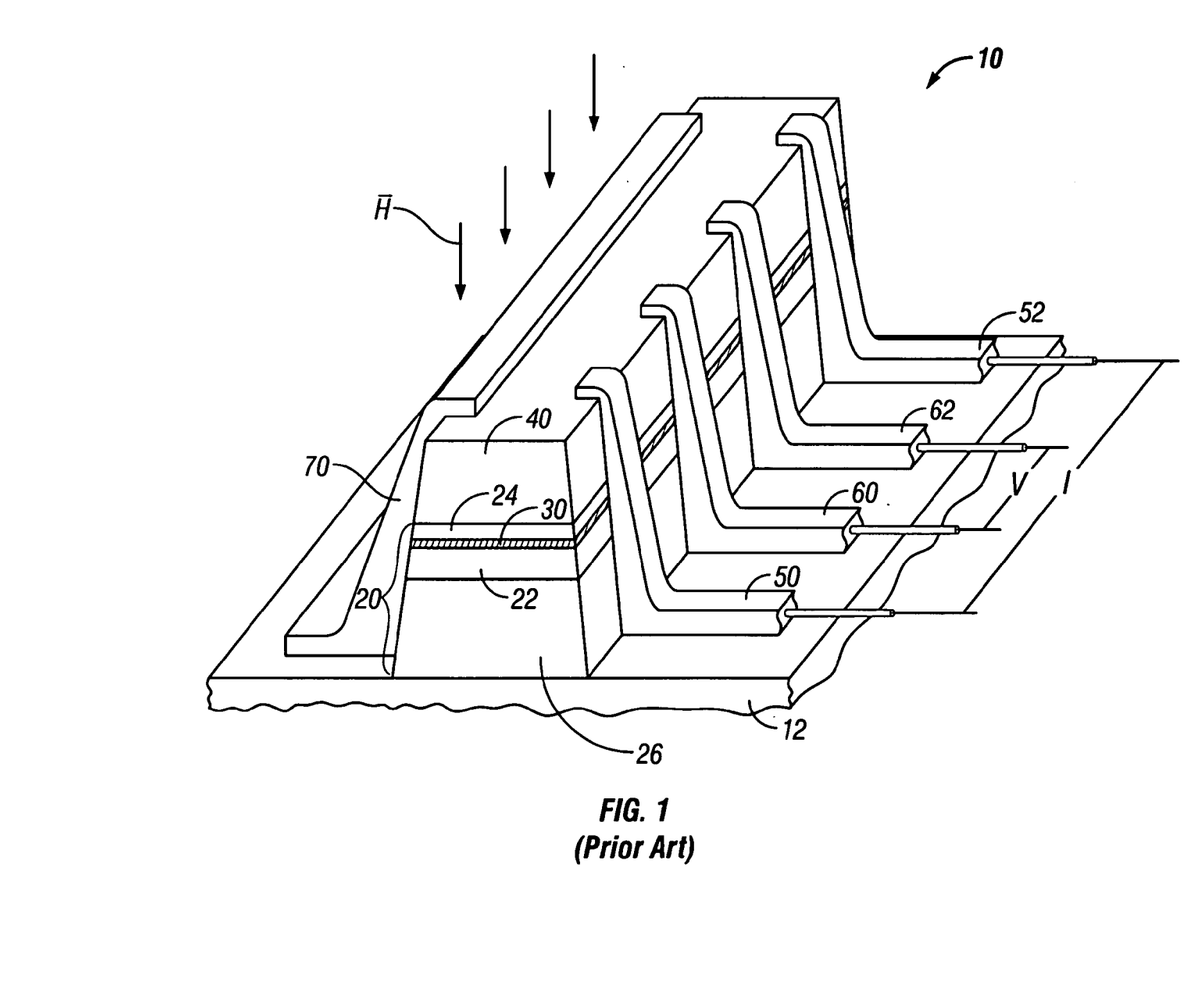
FIG. 1 is an isometric view of the prior art EMR sensor.

FIG. 1 is an isometric view of the prior art EMR sensor 10. The EMR sensor 10 includes a structure 20 that is a III–V heterostructure formed on a semiconducting substrate 12 such as GaAs. However, the EMR sensor described in this invention is not restricted to III–V semiconductor materials. For example, it may also be formed on the basis of silicon. The heterostructure 20 includes a first layer 22 of semiconducting material having a first band-gap, a second layer 30 of semiconducting material formed on top of the first layer 22 and having a second band gap smaller than the first band gap, and a third layer 24 of semiconducting material formed on top of the second layer 30 and having a third band gap greater than the second band gap. The materials in first and third layers 22, 24 may be similar or identical. An energetic potential well (quantum well) is created by the first, second and third semiconducting material layers due to the different band-gaps of the different materials. Thus carriers can be confined inside layer 30, which is considered the EMR active film in the sensor 10.

The first layer 22 is typically formed on top of a buffer layer 26 that may be one or more layers. The buffer layer 26 comprises several periods of a superlattice structure that function to prevent impurities present in the substrate from migrating into the functional layers 22, 24 and 30. In addition, the buffer layer 26 is chosen to accommodate the typically different lattice constants of the substrate 12 and the functional layers of the heterostructure 20 to thus act as a strain relief layer between the substrate and the functional layers.

One or more doped layers are incorporated into the semiconducting material in the first layer 22, the third layer 24, or both layers 22 and 24, and spaced apart from the boundary of the second and third semiconducting materials. The doped layers provide electrons (if n-doped) or holes if (p-doped) to the quantum well. The electrons or holes are concentrated in the quantum well in the form of a two-dimensional electron-gas or hole-gas, respectively.

As described in the previously-cited references, the layers 22/30/24 may be a $Al_{0.09}In_{0.91}Sb/InSb/Al_{0.09}In_{0.91}Sb$ heterostructure grown onto a semi-insulating GaAs substrate 12 with a buffer layer 26 in between. InSb is a narrow band-gap semiconductor. Narrow band-gap semiconductors typically exhibit have high electron mobility, since the effective electron mass is greatly reduced. Typical narrow band-gap materials are InSb and InAs. For example, the room temperature electron mobility of InSb and InAs are 70,000 $cm^2/Vs$ and 35,000 $cm^2/Vs$, respectively.

The bottom $Al_{0.09}In_{0.91}Sb$ layer 22 formed on the buffer layer 26 has a thickness in the range of approximately 1–3 microns and the top $Al_{0.09}In_{0.91}Sb$ layer 24 has a thickness in the range of approximately 10 to 1000 nm, typically 50 nm. The doping layers incorporated into layer 22 or 24 have a thickness from one monolayer (delta-doped layer) up to 10 nm. The doping layer is spaced from the $InSb/Al_{0.09}In_{0.91}Sb$ boundaries of first and second or second and third semiconducting materials by a distance of 10–300 Å. N-doping is preferred, since electrons typically have higher mobility than holes. The typical N-dopant is silicon with a concentration in the range of 1 to $10^{19}/cm^3$. The deposition process for the heterostructure 20 is preferably molecular-beam-epitaxy, but other epitaxial growth methods can be used.

A capping layer 40 is formed over the heterostructure 20 to protect the device from corrosion. The capping layer is formed of an insulating material such as oxides or nitrides of aluminum or silicon (e.g., $Si_3N_4$, $Al_2O_3$) or a non-corrosive semi-insulating semiconductor.

Two current leads 50, 52 and two voltage leads 60, 62 are patterned over one side of the EMR structure 20 so that they make electrical contact with the quantum well. A metallic shunt 70 is patterned on the side opposite the current and voltage leads of the EMR structure 20 so that it makes electrical contact with the quantum well. The applied magnetic field H, i.e., the magnetic field to be sensed, is shown by the arrows and is normal to the plane of the films in the EMR structure 20. The leads typically comprise metallic contacts, for example Au, AuGe, or Ge diffused into the device. The leads are typically formed after formation of the capping layer 40, and sometimes after removal of some of the capping layer material.

Figure 2:
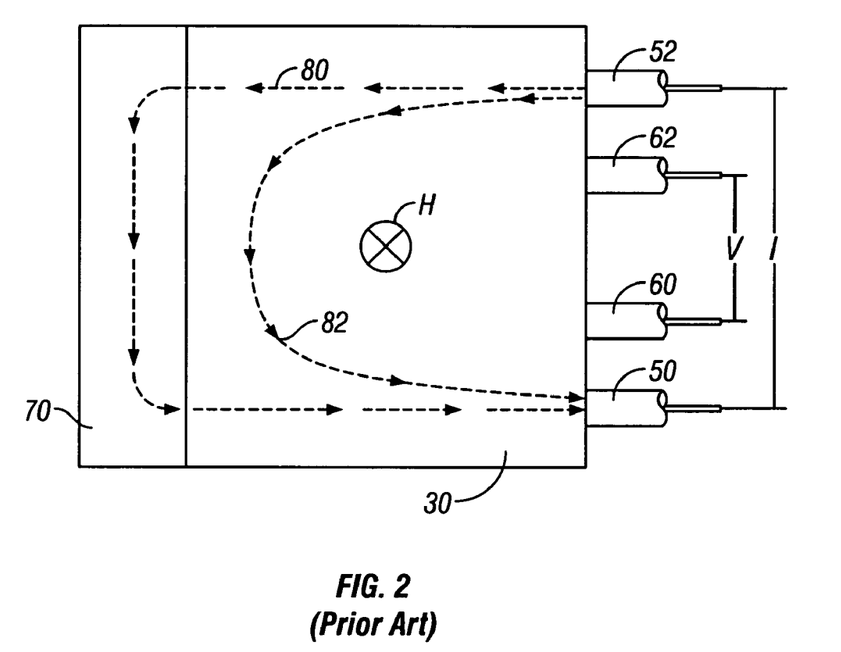
FIG. 2 is a top schematic view of the prior art EMR sensor of FIG. 1 through a section of the EMR active film illustrating the basic operation of the sensor.

FIG. 2 is a top schematic view of the EMR sensor 10 through a section of active film 30 and will illustrate the basic operation of the sensor. In the absence of an applied magnetic field H, sense current through leads 50, 52 passes into the semiconductor active film 30 and is shunted through shunt 70, as shown by line 80. When an applied magnetic field H is present, as shown by the arrow tail into the paper in FIG. 2, current is deflected from shunt 70 and passes primarily through the semiconductor active film 30, as shown by line 82. The change in electrical resistance due to the applied magnetic field is detected across the voltage leads 60, 62.

Figure 3A:
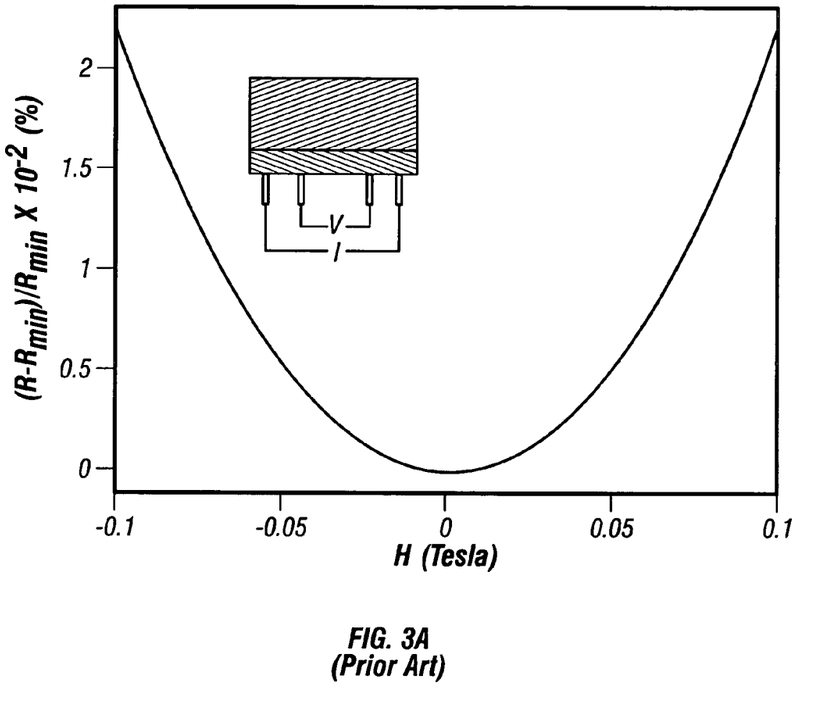
FIG. 3A is the theoretical magnetoresistance vs. field response for a prior art EMR sensor with symmetric current and voltage leads

One of the problems of the prior art EMR sensor 10 is that its magnetoresistance $[(R-R_{min})/R_{min}]$ is approximately quadratic as a function of the applied magnetic field. Therefore, in applied magnetic fields in the range of interest, i.e., the small magnetic fields from recorded magnetic media, the magnetoresistance response is small and nonlinear. This is shown by the theoretical magnetoresistance vs. field response in FIG. 3A for an EMR sensor with symmetric current and voltage leads like that shown in FIGS. 1–2 and in the diagram in FIG. 3A.

Figure 3B:
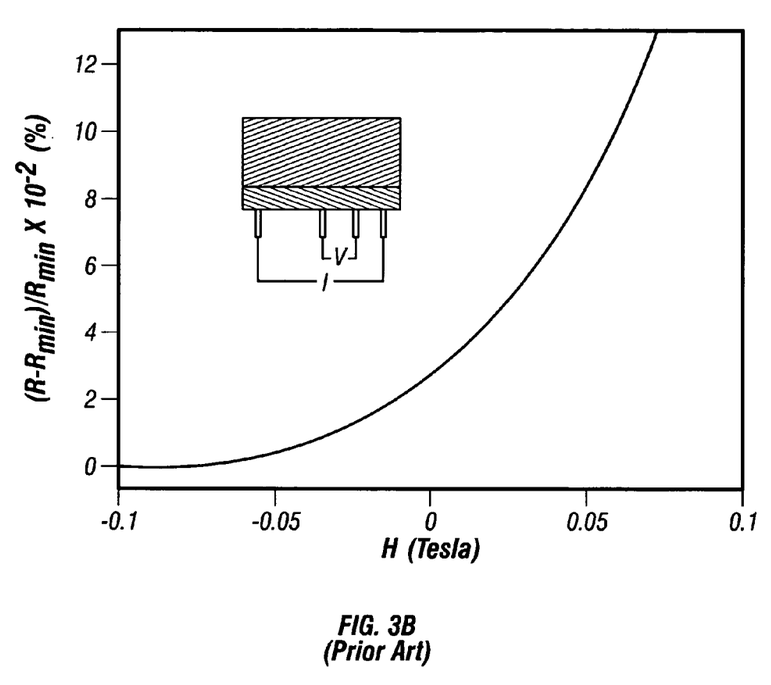
FIG. 3B is the theoretical magnetoresistance vs. field response for a prior art EMR sensor with asymmetric voltage leads.

Biasing of the EMR sensor has been proposed by an asymmetric location of the voltage leads, as shown by the diagram in FIG. 3B. FIG. 3B shows the theoretical magnetoresistance vs. field response for an EMR sensor with asymmetric voltage leads. The sensor of FIG. 3B has a higher magnetoresistance and a more linear response at zero applied magnetic field than the sensor of FIG. 3A.

Biasing of the EMR sensor has also been proposed by use of a single ferromagnetic layer that applies a perpendicular magnetic field to the sensor, as described in U.S. Pat. No. 6,714,374.

The Invention

The EMR sensor of this invention includes a layer of ferromagnetic material that is exchange-biased perpendicular to the plane of the layers with an antiferromagnetic layer and located on top of the EMR film structure. This antiferromagnetic/ferromagnetic (AF/F) bilayer structure provides a magnetic field that biases the magnetoresistance vs. field response of the EMR sensor. Perpendicular-to-the-plane exchange-biasing with coercivity enhancement and hysteresis loop-shifts in AF/F structures for which the ferromagnetic layer has an out-of-plane ferromagnetic easy axis is described in U.S. Pat. No. 6,650,513. The magnitude of the perpendicular exchange-bias effect is comparable to that found in similar AF/F structures for which the ferromagnetic layer is exchange-biased in the plane of the layers.

Figure 4:
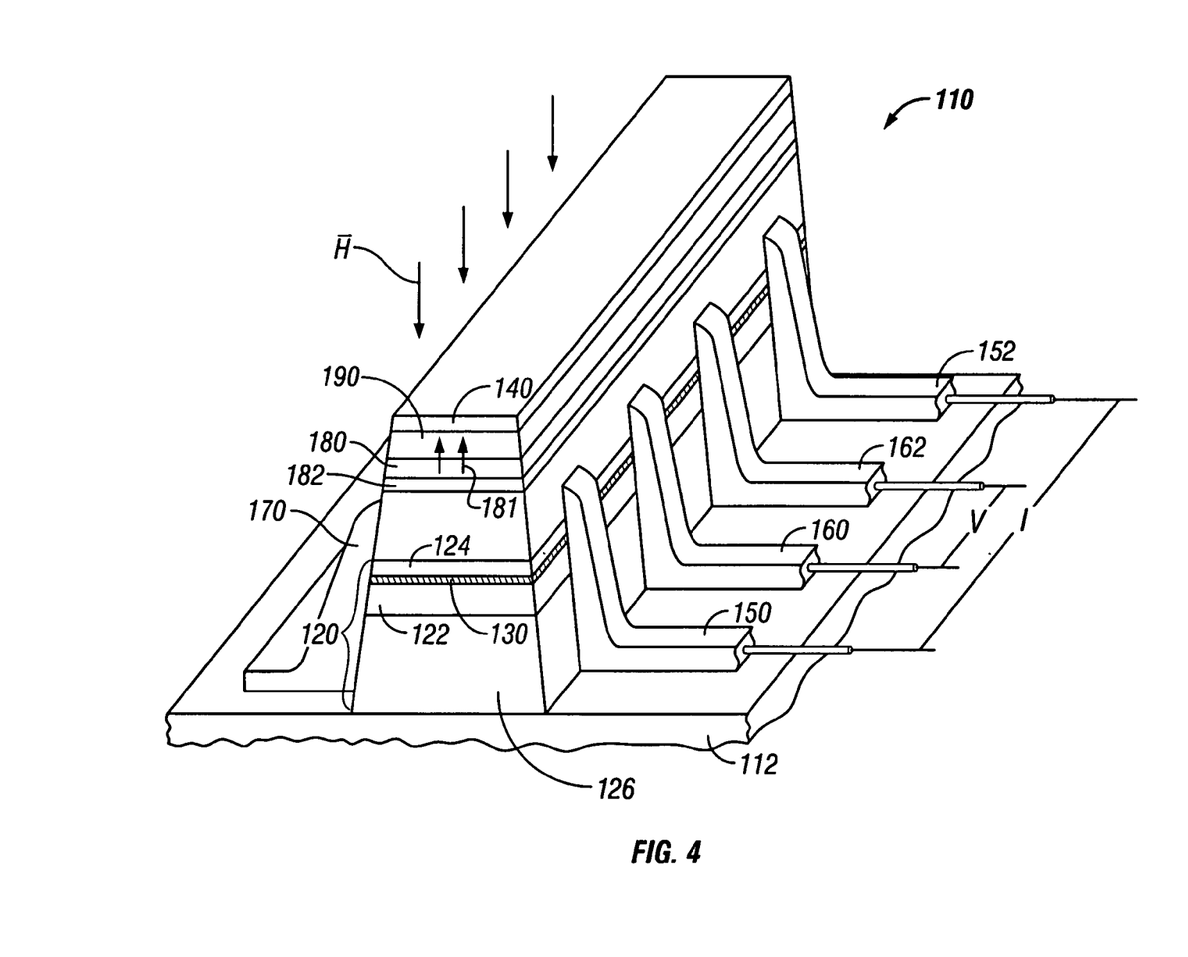
FIG. 4 is an isometric view of the EMR sensor according to this invention.

FIG. 4 is an isometric view of the EMR sensor according to this invention. The EMR sensor 110 is like the prior art sensor 10 in that has a quantum well film structure 120, including the first semiconducting layer 122, the second semiconducting and EMR active layer 130, and the third semiconducting layer 124, as well as buffer layer 126, formed on a semiconductor substrate 112. Two current leads 150, 152 and two voltage leads 160, 162 make electrical contact with EMR active film 130 and metallic shunt 170 makes electrical contact with EMR active film 130 on the side opposite the current and voltage leads. The applied magnetic field H, i.e., the magnetic field to be sensed, is shown by the arrows and is normal to the plane of the films in the EMR structure 120. A capping layer 140 is on top of sensor 110.

The EMR sensor 110 includes a ferromagnetic layer 180 also on substrate 112. In the preferred embodiment of FIG. 4 the EMR structure 120 is depicted between the substrate 112 and the ferromagnetic layer 180. Ferromagnetic layer 180 has perpendicular magnetic anisotropy and an out-of-plane magnetic moment 181 oriented perpendicular to the plane of EMR active film 130. The moment 181 from ferromagnetic layer 180 is a biasing magnetic field to which the EMR active film 130 is exposed. This shifts the magnetoresistance vs. field response curve so that at zero applied magnetic field the sensor 110 has a higher magnetoresistance and a more linear response. The ferromagnetic layer 180 that provides the biasing magnetic field is exchange-biased by an antiferromagnetic layer 190.

The magnetic field H generated from a ferromagnetic layer magnetized perpendicular to its plane can be approximated by the field of a uniformly magnetized square block of thickness t and length L. If the origin is at the top surface of the square block, the field H along a Y-axis perpendicular to the layer is given by $$H = 4M_S \arctan\left(\frac{q_2 - q_1}{1 + q_1 q_2}\right), \text{ where}$$

$$q_2 = \frac{4(y+t)}{L}\sqrt{\frac{1}{2} + \left(\frac{y+t}{L}\right)^2} \text{ and } q_1 = \frac{4y}{L}\sqrt{\frac{1}{2} + \left(\frac{y}{L}\right)^2}$$

and y is the distance along the Y-axis. As one example, for a Co layer magnetized perpendicular to its plane, and having a magnetization $M_S$ of about 1400 emu/cm$^3$, a length of L=100 nm and a thickness of t=10 nm, the magnetic field H is approximately 1400 Oe at y=10 nm.

The material for ferromagnetic biasing layer 180 may be any of the ferromagnetic materials useful for perpendicular magnetic recording, including FePt, CoPt or (FeCo)Pt alloys in the chemically ordered L1$_0$ phase, CoCrPt alloys and Co/Pd, Co/Pt, Fe/Pd, and Fe/Pt multilayers. The ferromagnetic layer is prepared in a way that its anisotropy axis is significantly out-of-plane, so that it is considered to have "perpendicular" magnetic anisotropy. These alloys and multilayers may also be doped with additional elements. For example, CoCrPtX alloys are proposed for perpendicular recording, where X=B, Nb, and Ta are the typical dopants. Similarly, the Co layers in Co/Pd and Co/Pt multilayers often include an element Y, so that the Co is a Co—Y alloy, where Y=B, Ta, Cr, O, Cu, Ag, Pt, Pd. Other suitable ferromagnetic materials are ferrites, such as Co-ferrite or Ni-ferrite. These ferrites have the advantage that they are insulating and thus no insulating layer needs to be used to separate the EMR heterostructure from the ferromagnetic biasing layer 180.

The antiferromagnetic layer 190 may be a sufficiently thick Mn alloy layer (PtMn, NiMn, FeMn, IrMn, PdMn, PtPdMn or RhMn). A PtMn layer needs to be thicker than approximately 100 Å to become chemically-ordered and antiferromagnetic when annealed, and an IrMn layer is antiferromagnetic as deposited when it is thicker than approximately 40 Å. These antiferromagnetic Mn alloys may also include small amounts of additional elements, such as Cr, V, Pt, Pd and Ni that are typically added to improve corrosion resistance or increase electrical resistance. Because these antiferromagnetic materials are metallic, it may be desirable to form the antiferromagnetic layer 190 of an electrically insulating material, such as known antiferromagnetic materials formed of a cobalt oxide, a nickel oxide, and an oxide of an alloy of cobalt and nickel.

The ferromagnetic layer 180 has an intrinsic coercivity of $H_{C0}$. When exchange-coupled to the antiferromagnetic layer 190 its coercivity will become enhanced to $H_C > H_{C0}$ and its M-H loop will be shifted by the exchange field $H_E$. The exchange field $H_E$ is determined by the magnetic coupling strength $J_A$ between the ferromagnetic layer 180 and the antiferromagnetic layer 190, and the thickness $t_F$ and magnetization $M_F$ of the ferromagnetic layer 180 according to the following:

$$H_E = J_A/M_F t_F.$$

Thus, when the EMR sensor 110 is intended for use in a magnetic recording read head, the value ($H_E+H_C$) must be greater than the field from the magnetic transition on the magnetic media, i.e. the sensing field which is typically in the range of +/−200 to +/−500 Oe, but lower than the magnetic field that is required to reverse the bits of the magnetic media. A value of ($H_E+H_C$) greater than the field from the magnetic transition assures that the moment 181 of ferromagnetic layer 180 will not be switched when exposed to the applied magnetic field. Thus, due to the exchange-biasing field $H_E$, which can be relatively large, the intrinsic coercivity $H_{C0}$ of the ferromagnetic layer 180 can be relatively low. This allows a wider choice of materials and thicknesses for ferromagnetic layer 180. For example, the use of a [Co(0.7 nm)/Pt(0.5 nm)]$_3$ multilayer as ferromagnetic layer 180 and a 15 nm thick PtMn layer as the antiferromagnetic layer 190 results in $H_E$ of approximately 200 Oe and $H_C$ of approximately 450 Oe. A [Co(0.7 nm)/Pt(0.5 nm)]$_3$ multilayer has a relatively low intrinsic coercivity $H_{C0}$ of approximately about 100 Oe, which is even less than the sensing field.

The [Co(0.7 nm)/Pt(0.5 nm)]$_3$ multilayer in the above example is one of the group of Co/Pt, Co/Pd, Fe/Pt, and Fe/Pd multilayers that exhibit intrinsic perpendicular-to-the-plane magnetic anisotropy. These multilayers are especially useful in the present invention because they can be prepared within a wide range of coercivities and effective magnetizations, even when deposited at room or low temperatures. The high tunability of these multilayers is due to the large moment of the Co and Fe and the much smaller induced moment of the Pt or Pd, as well as the high ferromagnetic coupling of the Fe or Co layers across the Pt or Pd. In addition, these multilayers have M-H loops that have high squareness, i.e., the ratio of remanent to saturated moment is close to 1.

The EMR sensor 110 may also optionally include a diffusion barrier 182 between the EMR structure 120 and the ferromagnetic layer 180. Suitable materials for the diffusion barrier 182 include oxides and nitrides of aluminum and silicon, e.g., Al$_2$O$_3$, SiO$_2$ and Si$_3$N$_4$.

In FIG. 4, the antiferromagnetic/ferromagnetic bilayer 180/190 is depicted with the antiferromagnetic layer 190 above the ferromagnetic layer 180. However, the antiferromagnetic layer 190 may be located below ferromagnetic layer 180. In such an arrangement then if the antiferromagnetic layer 190 is electrically insulating, the diffusion barrier 182 may not be required.

The EMR sensor 110 is fabricated in the following manner. A heterostructure as previously described is grown onto a semi-insulating substrate. A mesa defining the shape of the EMR sensor to be fabricated is etched by reactive-ion-etching (RIE) or ion-milling. The leads 150, 152, 160, 162 and shunt 170 are then deposited, for example by use of shadow masks. Next, an insulating material such as alumina is deposited as diffusion barrier 182 above the mesa, leads and shunt. The structure is then planarized, for example by chemical-mechanical polishing (CMP). The ferromagnetic layer 180 and antiferromagnetic layer 190 are deposited on top of the planarized surface by sputtering, ion-beam deposition, evaporation, molecular chemical vapor deposition (MOCVD) or a combination of these techniques. The ferromagnetic layer 180 and antiferromagnetic layer 190 are then partially removed by RIE or ion-milling so that only the part of these layers directly above the EMR mesa structure, and in particular above the EMR active region, remains. If a chemically ordered antiferromagnet like PtMn or NiMn is used for layer 190 then the structure is annealed in the presence of a magnetic field oriented perpendicular to the planes of the layers. The alloy chemically orders and undergoes a paramagnetic-to-antiferromagnetic phase transition. Upon cooling to below the blocking temperature of the antiferromagnet, i.e., the temperature at which the exchange-coupling between the ferromagnetic layer 180 and the antiferromagnetic layer 190 develops, the magnetization direction 181 of ferromagnetic layer 180 is set and fixed by antiferromagnetic layer 190. Alternatively the ferromagnetic layer 180 and antiferromagnetic layer 190 can be deposited at elevated temperature so that chemical order in the antiferromagnetic layer 190 is already induced during the deposition. The structure is then cooled from the deposition temperature through the blocking temperature in a magnetic field oriented perpendicular to the planes of the layers. If a chemically disordered antiferromagnet like IrMn or FeMn is used for layer 190 then no annealing is necessary. It is simply enough to deposit the ferromagnetic layer 180 and antiferromagnetic layer 190 in the presence of a magnetic field oriented perpendicular to the planes of the layers. However a post-deposition anneal in the presence of a magnetic field oriented perpendicular to the planes of the layers may be desirable since it may increase the biasing field $H_E$.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. An extraordinary magnetoresistance (EMR) sensor comprising:
    a semiconductor substrate;
    an EMR active film on the substrate, the active film comprising a nonmagnetic semiconductor material responsive to a magnetic field generally perpendicular to the active film;
    an electrically conductive shunt in contact with the active film;
    a pair of current leads in contact with the active film;
    a pair of voltage leads in contact with the active film;
    a ferromagnetic layer on the substrate and having its magnetic moment oriented generally perpendicular to the planes of the ferromagnetic layer and active film; and
    an antiferromagnetic layer in contact with the ferromagnetic layer, the magnetic moment of the ferromagnetic layer being perpendicularly biased by the antiferromagnetic layer.

2. The sensor of claim 1 wherein the material of the ferromagnetic layer is selected from the group consisting of a cobalt-platinum-chromium alloy, an iron-platinum alloy, one or more cobalt-platinum bilayers, one or more cobalt-palladium bilayers, one or more iron-platinum bilayers, and one or more iron-palladium bilayers.

3. The sensor of claim 2 wherein the material of the ferromagnetic layer is a multilayer selected from the group of Co/Pt, Co/Pd, Fe/Pt and Fe/Pd multilayers.

4. The sensor of claim 1 wherein the material of the ferromagnetic layer is selected from the group consisting of (a) one or more bilayers of a Co—Y alloy and Pt and (b) one or more bilayers of a Co—Y alloy and Pd, wherein Y is selected from the group consisting of B, Ta, Cr, O, Cu, Ag, Pt and Pd.

5. The sensor of claim 1 wherein the material of the ferromagnetic layer is the chemically ordered $L1_0$ phase of a material selected from the group consisting of FePt, CoPt and (FeCo)Pt.

6. The sensor of claim 1 wherein the material of the ferromagnetic layer is an electrically insulating ferrite.

7. The sensor of claim 1 wherein the ferromagnetic layer is located between the EMR active film and the antiferromagnetic layer.

8. The sensor of claim 1 wherein the antiferromagnetic layer is located between the EMR active film and the ferromagnetic layer.

9. The sensor of claim 1 wherein the EMR active film is located between the substrate and the ferromagnetic layer.

10. The sensor of claim 1 wherein the antiferromagnetic layer is selected from the group consisting of a cobalt oxide, a nickel oxide, and an oxide of an alloy of cobalt and nickel.

11. The sensor of claim 1 wherein the antiferromagnetic layer is an alloy comprising Mn and at least one element selected from the group consisting of Pt, Rh, Ni, Fe, Ir and Pd.

12. The sensor of claim 1 further comprising a diffusion barrier between the EMR active film and the ferromagnetic layer.

13. The sensor of claim 1 wherein the diffusion barrier is selected from the group consisting of aluminum oxides, aluminum nitrides, silicon oxides, and silicon nitrides.

14. An extraordinary magnetoresistance (EMR) sensor comprising:
    a semiconductor substrate;
    an EMR active film on the substrate, the active film comprising a nonmagnetic semiconductor material responsive to a magnetic field generally perpendicular to the active film;
    an electrically conductive shunt in contact with the active film;
    a pair of current leads in contact with the active film;
    a pair of voltage leads in contact with the active film; and
    an antiferromagnetic/ferromagnetic exchange-coupled bilayer on the active film providing a biasing magnetic field substantially perpendicular to the plane of the active film, said bilayer comprising (a) a ferromagnetic layer formed of a material selected from the group consisting of a cobalt-platinum-chromium alloy, an iron-platinum alloy, one or more cobalt-platinum bilayers, and one or more cobalt-palladium bilayers; and (b) an antiferromagnetic layer exchange-coupled with the ferromagnetic layer and formed of a material selected from the group consisting of a cobalt oxide, a nickel oxide, an oxide of an alloy of cobalt and nickel, and an alloy comprising Mn and an element selected from the group consisting of Pt, Ni, Fe, Ir and Pd.

15. The sensor of claim 14 wherein the material of the ferromagnetic layer is one or more bilayers of cobalt and platinum or one or more bilayers of cobalt and palladium, and wherein the cobalt layers in said bilayers include an element selected from the group consisting of B, Ta, Cr, O, Cu, Ag, Pt and Pd.

16. The sensor of claim 14 wherein the material of the ferromagnetic layer is a cobalt-platinum-chromium alloy that includes an element selected from the group consisting of B, Nb and Ta.

17. The sensor of claim 14 wherein the antiferromagnetic layer provides an exchange field $H_E$ to the ferromagnetic layer, wherein the ferromagnetic layer has an intrinsic coercivity $H_{C0}$ that is enhanced by $H_E$ to a coercivity $H_C$ greater than $H_{C0}$, and wherein the sum of $H_E$ and $H_C$ is greater than the magnetic field to be sensed by the sensor.

18. The sensor of claim 17 wherein the intrinsic coercivity $H_{C0}$ of the ferromagnetic layer is less than the magnetic field to be sensed.

19. The sensor of claim 14 wherein the ferromagnetic layer is located between the EMR active film and the antiferromagnetic layer.

20. The sensor of claim 14 wherein the antiferromagnetic layer is located between the EMR active film and the ferromagnetic layer.

21. The sensor of claim 14 further comprising a diffusion barrier between the EMR active film and the antiferromagnetic/ferromagnetic bilayer.

22. The sensor of claim 21 wherein the diffusion baffler is selected from the group consisting of aluminum oxides, aluminum nitrides, silicon oxides, and silicon nitrides.

* * * * *